(12) United States Patent
Rivet et al.

(10) Patent No.: US 10,784,787 B2
(45) Date of Patent: Sep. 22, 2020

(54) CONTROL CIRCUIT FOR HALF-BRIDGE DIODES

(71) Applicant: STMicroelectronics (Tours) SAS, Tours (FR)

(72) Inventors: Bertrand Rivet, Vouvray (FR); Greca Jean Charles, Tours (FR); Frederic Lanois, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 1078 days.

(21) Appl. No.: 14/525,460

(22) Filed: Oct. 28, 2014

(65) Prior Publication Data

US 2015/0117063 A1 Apr. 30, 2015

(30) Foreign Application Priority Data

Oct. 31, 2013 (FR) ..................... 13 60660

(51) Int. Cl.
*H02M 3/335* (2006.01)
*H03K 17/16* (2006.01)
(Continued)

(52) U.S. Cl.
CPC ......... *H02M 3/33546* (2013.01); *H02M 1/08* (2013.01); *H03K 3/012* (2013.01);
(Continued)

(58) Field of Classification Search
CPC ......... H02M 2007/2195; H02M 7/219; H02M 1/08; H02M 1/15; H02M 3/33546;
(Continued)

(56) References Cited

U.S. PATENT DOCUMENTS 3,947,727 A * 3/1976 Stewart ............ H03K 17/08122
361/91.5
8,148,748 B2 4/2012 Ankoudinov et al.
(Continued)

FOREIGN PATENT DOCUMENTS

CN 104600991 B 5/2015
EP 1355416 A1 10/2003
(Continued)

OTHER PUBLICATIONS

INPI Search Report and Written Opinion for FR 1360660 dated Jul. 10, 2014 (7 pages).
(Continued)

*Primary Examiner* — Jue Zhang
*Assistant Examiner* — Henry E Lee, III
(74) *Attorney, Agent, or Firm* — Crowe & Dunlevy

(57) ABSTRACT

A circuit includes a first field-effect transistor and a second field-effect transistor. The first field-effect transistor includes a first diode with drain, source, gate and first additional electrodes. The second field-effect transistor includes a second diode with drain, source, gate and second additional electrodes. A first switch selectively connects the gate and drain electrodes of the first field-effect transistor. A second switch selectively connects the gate and drain electrodes of the second field-effect transistor. A control circuit controls the first and second switches. The first additional electrode is coupled to the gate electrode of the second field-effect transistor, and the second additional electrode is coupled to the gate electrode of the first field-effect transistor.

28 Claims, 3 Drawing Sheets

(51) Int. Cl.
*H03K 17/687* (2006.01)
*H03K 17/74* (2006.01)
*H02M 1/08* (2006.01)
*H03K 3/012* (2006.01)

(52) U.S. Cl.
CPC ....... *H03K 17/161* (2013.01); *H03K 17/6871* (2013.01); *H03K 17/74* (2013.01)

(58) Field of Classification Search
CPC ................ H02M 7/521; H02M 7/5387; H03K 17/6871; H03K 17/161; H03K 17/74; H03K 3/012
See application file for complete search history.

(56) References Cited

U.S. PATENT DOCUMENTS

| | | | |
|---|---|---|---|
| 8,421,118 B2* | 4/2013 | Ankoudinov | ....... H01L 27/0817 257/119 |
| 2008/0084715 A1* | 4/2008 | Hsu | ................... H02M 3/33561 363/21.04 |
| 2008/0191216 A1* | 8/2008 | Machida | ................. H01L 25/18 257/76 |
| 2009/0267111 A1 | 10/2009 | Ankoudinov et al. | |
| 2010/0271851 A1 | 10/2010 | Ankoudinov et al. | |
| 2011/0051305 A1 | 3/2011 | Ankoudinov et al. | |

FOREIGN PATENT DOCUMENTS

| WO | WO-2010030400 A1 | 3/2010 |
|---|---|---|
| WO | WO-2010127370 A2 | 11/2010 |

OTHER PUBLICATIONS

First Office Action and Search Report for co-pending CN Appl. No. 201810037075.5 dated Jul. 16, 2019 (6 pages).

* cited by examiner

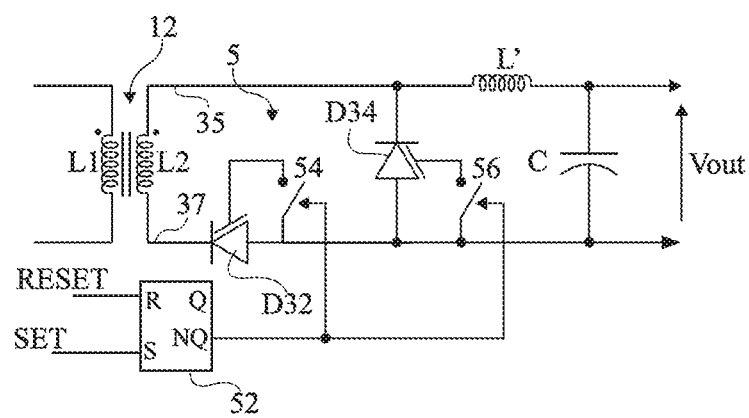
Fig 6
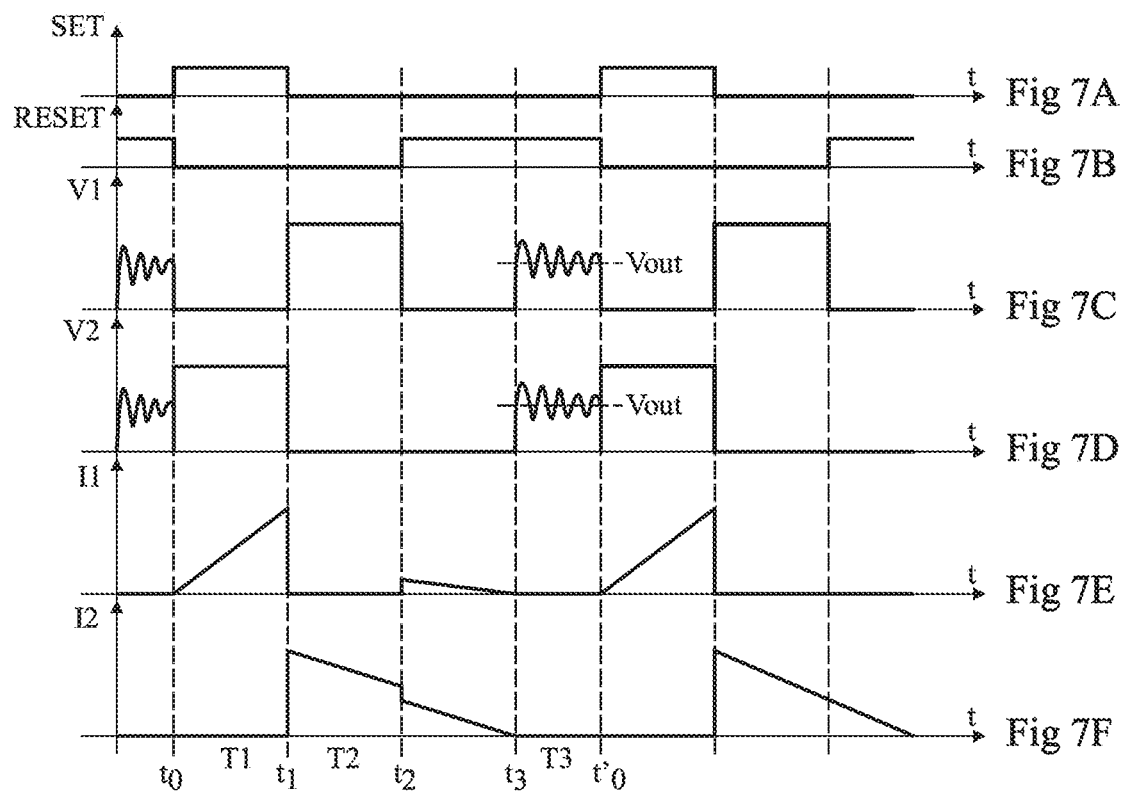

CONTROL CIRCUIT FOR HALF-BRIDGE DIODES

PRIORITY CLAIM

This application claims the priority benefit of French Patent application number 1360660, filed on Oct. 31, 2013, the contents of which is hereby incorporated by reference in its entirety to the maximum extent allowable by law.

TECHNICAL FIELD

The present disclosure generally relates to electronic circuits and, more specifically, to a control circuit for field-effect diodes assembled in a half-bridge. The present disclosure more specifically applies to the forming of a converter in the form of a switched-mode power supply.

BACKGROUND

Switched-mode power supplies use, in particular at the secondary, free wheel diodes which are most often assembled with a common electrode (anode or cathode), and thus in a half-bridge.

In the forming of a power converter, it is often difficult to find an acceptable compromise between the voltage across the diodes in the on state and the off-state leakage current.

SUMMARY

An embodiment overcomes all or part of the disadvantages of assemblies using diodes assembled in a half-bridge.

Another embodiment provides a half-bridge diode assembly with an improved compromise between the forward voltage drop and the leakage current.

Another embodiment uses field-effect diodes comprising a diffusion pocket in the substrate.

An embodiment provides a circuit comprises: a first field-effect transistor assembled as a first diode and provided with drain, source, and gate electrodes, as well as with an additional electrode; a second field-effect transistor assembled as a second diode and provided with drain, source, and gate electrodes as well as with an additional electrode; a first switch connecting the gate of the first transistor to its drain; a second switch connecting the gate of the second transistor to its drain; and a circuit for controlling the first and second switches.

According to an embodiment: the additional electrode of the first transistor is further directly connected to the gate of the second transistor; and the additional electrode of the second transistor is further directly connected to the gate of the first transistor.

According to an embodiment, the two switches are controlled to be simultaneously off in a phase where one of the diode risks, under the effect of the connection of its gate to the additional electrode of the other diode, being on while it is reverse biased.

According to an embodiment, the diodes are interconnected by their anodes.

According to an embodiment, the diodes are interconnected by their cathodes.

According to an embodiment, each additional electrode contacts a diffusion pocket in a substrate.

According to an embodiment, each additional electrode contacts an insulating layer.

An embodiment also provides a power converter of switched-mode power supply type comprising, at the secondary of a transformer, at least one inductive element and one capacitive element, and a circuit such as described hereabove.

According to an embodiment, the first diode connects a reference terminal of a voltage provided by the converter to an electrode of a winding of the secondary of the transformer, the second diode connecting this reference terminal to the other terminal of this winding of the secondary.

According to an embodiment, said control circuit is formed of a flip-flop having an inverted output controlling said switches formed of MOS transistors, and having its set and reset terminals receiving control signals from a circuit for controlling the power converter.

BRIEF DESCRIPTION OF THE DRAWINGS

The foregoing and other features and advantages will be discussed in detail in the following non-limiting description of specific embodiments in connection with the accompanying drawings.

FIG. 6 illustrates an example of assembly of the circuit of FIG. 5 at the secondary of a forward-type power converter; and FIGS. 7A, 7B, 7C, 7D, 7E, and 7F illustrate, in the form of timing diagrams, the operation of the circuit of FIG. 6.

DETAILED DESCRIPTION

Figure 1:
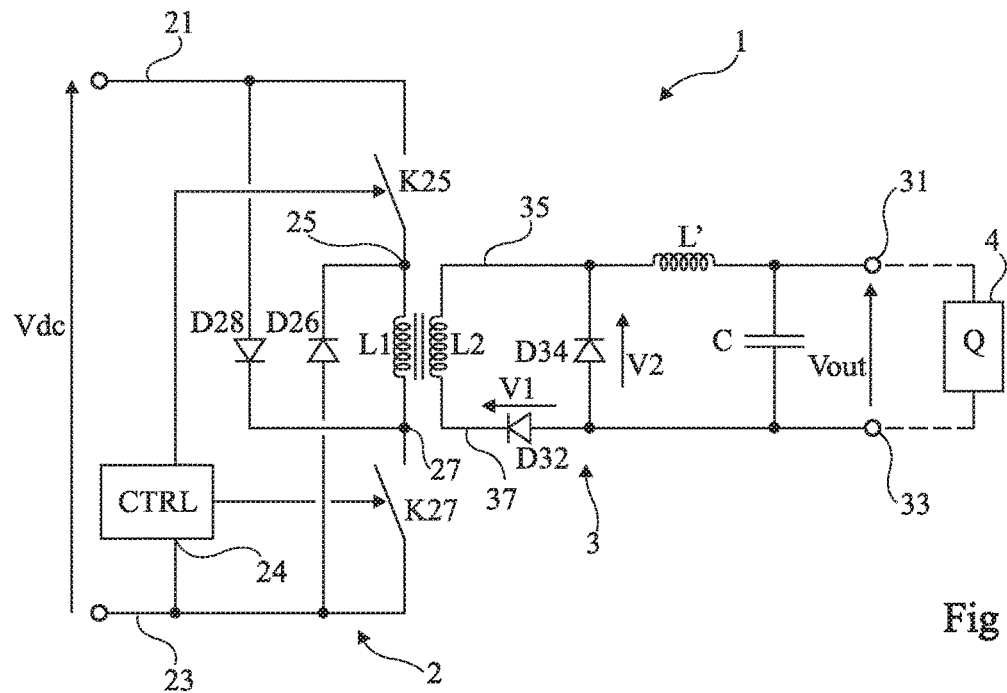
FIG. 1 is a simplified representation of a power converter formed of a switched-mode power supply of voltage-step down type (forward type)

The same elements have been designated with the same reference numerals in the different drawings. For clarity, only those steps and elements which are useful to the understanding of the embodiments which will be described have been shown and will be detailed. In particular, the control of a power converter of switched-mode power supply type has not been detailed, the described embodiments being compatible with the usual forming of such power converters. Further, the forming of field-effect diodes with a diffusion pocket in the substrate has not been detailed. To form such diodes, reference is made to U.S. Pat. Nos. 8,148,748 and 8,421,118, and also to United States Patent Application Publication Nos. 2009/0267111, 2010/0271851 and 2011/0051305, the contents of which are hereby incorporated by reference to the extent allowable by the law, may be used as a guideline. Further, the applications for which the control circuit and the power converter may be intended have not been detailed, the described embodiments being here again compatible with usual applications of such converters.

FIG. 1 very schematically shows an example of a power converter of forward switched-mode power supply type, for example, of voltage step-down type. It should however be noted that this type of converter may also be used as a voltage step-up converter. Its operation is based on a galvanic isolation (transformer 12) between a primary 2 and a secondary 3 and a switching of a D.C. voltage Vdc applied between two terminals 21 and 23 for powering the primary. In the shown example, an inductive element L1 forming the primary of transformer 12 is connected, via switches, respectively K25, K27, to terminals 21 and 23. Switches K25 and K27 have the function, under control of a circuit 24 (CTRL) of switching D.C. voltage Vdc, such a switching being transmitted by transformer 12 to its secondary 3. Two diodes D26 and D28 connect respective junction nodes 25 and 27 of winding L1 and switches K25 and K27 to terminals 23 and 21, the anode of diode D26 being on the side of terminal 23 and the cathode of diode D28 being on the side of node 21. The function of circuit 24 is to cause the turning-on of switches K25 and K27 at a relatively high frequency (in the range from some ten to some hundred kilohertz). At the secondary of transformer 12, an inductive winding L' associated with a capacitive element C and with a rectifying half-bridge formed of diodes D32 and D34 is used to rectify and to smooth the voltage recovered across inductive winding L2 forming the transformer secondary, to provide a D.C. output voltage Vout between terminals 31 and 33. Element L' connects a first terminal 35 of secondary winding L2 to terminal 31. Capacitive element C connects terminals 31 and 33. Diode D32 connects a second terminal 37 of winding L2 to terminal 33, its anode being on the side of terminal 33. Finally, diode D34 connects first terminal 35 of winding L2 to terminal 33, its anode being on the side of terminal 33. In FIG. 1, a load 4 (Q) intended to be connected to terminals 31 and 33 in order to be powered by voltage Vout has been illustrated.

The operation of a switched-mode power supply such as illustrated in FIG. 1 is usual. Most often, circuit 24 adapts the duty cycle of the on periods of switches K25 and K27 according to the power needs of load 4.

A problem associated with the use of diodes is that they generate conduction losses due to their on-state voltage drop.

A type of field-effect diodes based on a vertical MOS transistor structure has recently been developed, which enables to improve the compromise between the forward voltage drop (due to the on-state drain-source resistance and to a potential barrier created by the gate-source connection) and the reverse leakage current. Ideally, it is desired for these two quantities to be minimal.

This type of field-effect diodes comprises, in addition to the usual source, drain, gate, and substrate electrodes (in the MOS sense of the term), an additional electrode, called pocket electrode, connected either to a diffusion pocket taking up a portion of the space separating two MOS transistor channels, or to a polysilicon layer deposited on the gate oxide above this same space, to form a capacitance therewith.

In the diode mode operation, the source, gate, bulk (in the MOS sense of the term), and pocket electrodes are interconnected, and there thus only remain two separate electrodes, the source and drain electrodes.

In the case of a half-bridge assembly, only the source and substrate electrodes are interconnected. The gate electrode of one of the diodes of half-bridge is connected to the pocket electrode of the other diode, and conversely.

Figure 2:
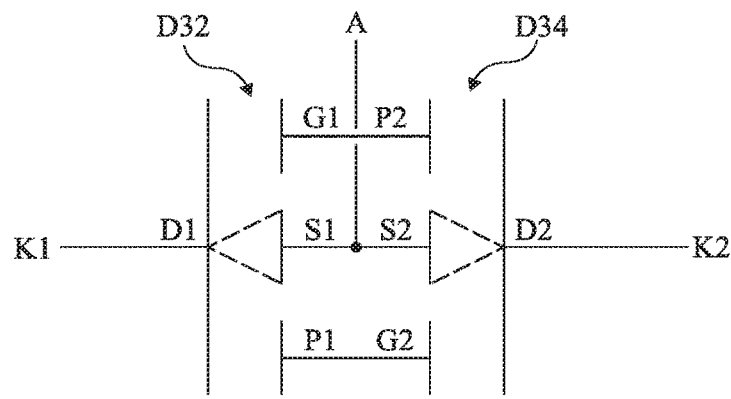
FIG. 2 is a simplified representation of an example of field-effect diodes with a diffusion pocket in the substrate, assembled in a half-bridge.

FIG. 2 is a simplified representation of an embodiment of diodes D32 and D34 using a technology of field-effect diodes with diffusion pockets connected to the substrate.

Figure 3:
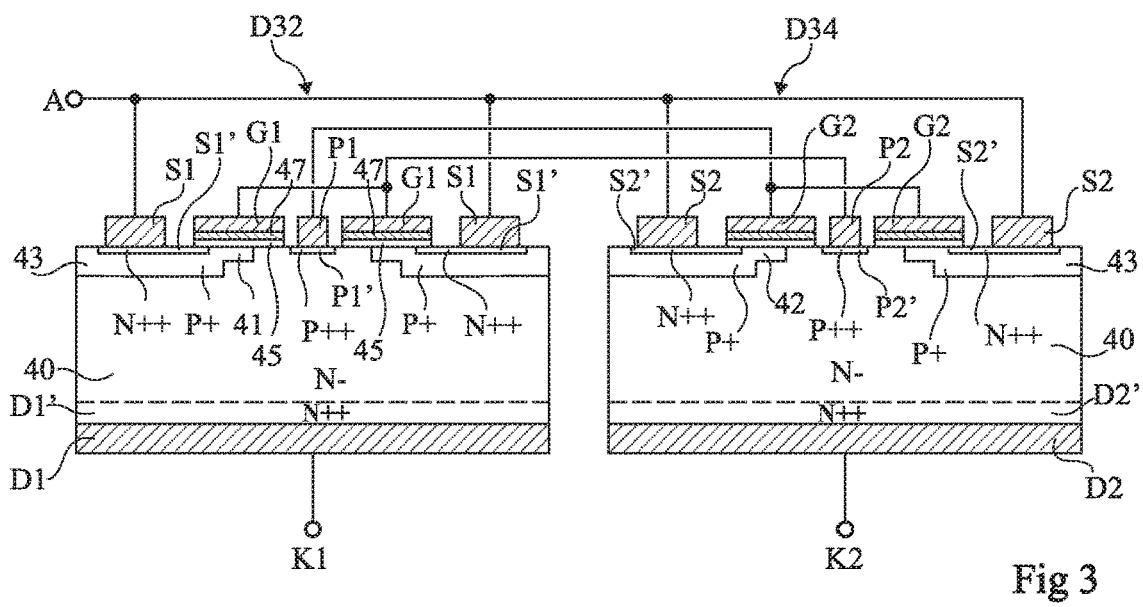
FIG. 3 is a simplified cross-section view of a structure reproducing the diagram of FIG. 2.

FIG. 3 is a simplified example of structure of diodes D32 and D34 according to the diagram of FIG. 2.

FIGS. 2 and 3 are inspired from the embodiments described in document U.S. Pat. No. 8,421,118.

In this example, the diodes are formed by using a vertical MOS transistor technology in an N-type wafer 40 (N−). Regions of wafer 40 each defining diodes are separated, generally by sawing of the wafer where they are formed, the resin of the packages (not shown) isolating the diodes from one another.

Each transistor forming one of the diodes comprises four electrodes:

a source electrode S1, respectively S2, contacting an N-doped source region S1', respectively S2', (N++), as well as a P-doped so-called bulk region (in the MOS sense of the term) 43 (P+);

a drain electrode D1, respectively D2, contacting a drain region D1', respectively D2', of type N (N++);

a gate electrode G1, respectively G2, contacting a polysilicon layer 47 deposited on an insulating layer 45 (gate oxide) and controlling the conductivity of a narrow channel 41, respectively 42, in a P-type region (P+); and an additional pocket electrode P1, respectively P2, contacting a diffusion pocket P1', respectively P2', in this example, of type P (P++), in wafer 40.

A function of the pocket electrode is to extract a signal which may be used as a gate control signal for the neighboring transistor forming the other diode.

In the example of FIG. 3, ring-shaped concentric gates and sources are considered, the pocket electrodes being at the center.

Figure 3A:
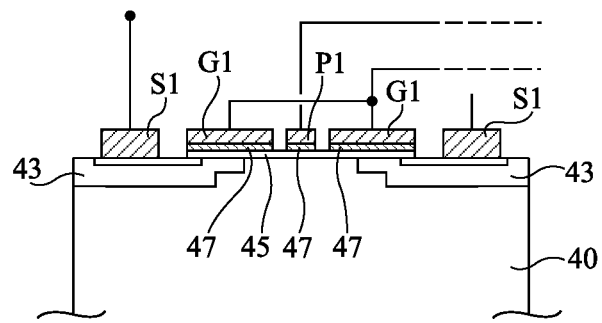
FIG. 3A is a partial simplified cross-section view of another structure reproducing the diagram of FIG. 2.

FIG. 3A illustrates an embodiment where the diffusion pocket is replaced with a capacitor. FIG. 3A only illustrates the left-hand portion of the structure (diode D32). The same modification is performed on the other diode (D34).

As compared with the embodiment of FIG. 3, insulating layer 45 (gate oxide) here extends under additional electrode P1, which contacts this insulating layer with a pad in polysilicon layer 47.

When the structure, for example, D32, is in the conductive state, the voltage drop between source S1' and drain D1' is small, generating a low signal at the level of pocket P1'. In the non-conductive state, the depleted area changes with the voltage applied between the source and the drain. For a low applied voltage, the depletion area is located between pocket P1' and the source and typically ends under the gate. In this state, pocket P1' can be considered as shorted with the drain, and the voltage of pocket electrode P1 follows that of drain electrode D1. However, for higher applied voltages, the depletion area extends under pocket P1'. The pocket voltage is then substantially constant and independent from the drain voltage. The signal present on pocket electrode P1 can thus be used as a signal indicative of the conductive or non-conductive state of structure D32.

To form a diode half-bridge, gate G1 of the transistor forming diode D32 is connected to pocket P2 of structure D34 while gate G2 thereof is connected to pocket P1 of structure D32.

In the example of an embodiment based on N-channel transistors such as illustrated in FIG. 3, sources S1 and S2 are interconnected to form the common anode of diodes D32 and D34 (A) while respective drains D1 and D2 define the respective cathodes K1 and K2 of diodes D32 and D34. Such an interconnection enables to take advantage of the electric characteristics of structures with diffusion pockets and in particular to make the compromise between the forward voltage and the leakage current easier. In other words, for a given leakage current, the forward voltage of a diode of the half-bridge, when its gate is biased by the pocket electrode of the other half-diode of the half-bridge, itself reverse-biased, will be significantly lower than that of a usual diode, including when it is formed from the same structure operating in simple diode mode (shorted source, gate, and diffusion pocket).

Figure 4:
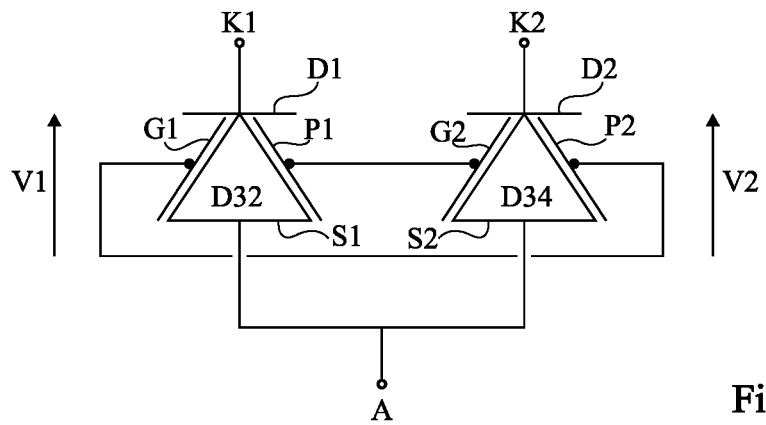
FIG. 4 is a simplified representation of the pair of field-effect diodes of FIG. 3.

FIG. 4 is a simplified representation of diodes D32 and D34, connected in the same way as in FIGS. 2 and 3. The diodes have been specifically symbolized in a way showing their respective pocket electrodes P1 and P2 and gate electrodes G1 and G2 and their cross-connections.

In an assembly of the type in FIG. 1, the respective conductive and non-conductive states of the diodes only depend on the voltages applied thereacross (anode and cathode).

There thus are four possible states for these two diodes. A state where cathode-anode voltages V1 and V2 are both positive. A state where cathode-anode voltages V1 and V2 are both negative. A state where voltage V1 is positive and voltage V2 is negative. A state where voltage V1 is negative and voltage V2 is positive.

Assuming a positive voltage V1 and a negative voltage V2, diode D32 is on and diode D34 is off. The fact for pocket electrode P2 to be connected to gate G1 improves (decreases) the forward voltage drop. The voltage of pocket P1 is very low since its barrier height has been lowered by the biasing transferred from the pocket of the other half-diode. Accordingly, the reverse diode will have a gate voltage substantially equal to its source voltage and the leakage current will thus be equivalent to that of a diode having its gate and source electrodes shorted (which corresponds to the conventional structure).

The reverse state corresponds to a positive voltage V2 across diode D34 and a negative voltage V1 across diode D32. Diode D34 is then conductive and diode D32 is non-conductive. Like for the above case, the non-conductive diode has a pocket voltage which lowers the barrier height of the conductive diode, which thus has a lower forward voltage.

In the case where the two diodes are forward biased (voltages V1 and V2 positive), their pocket voltage remains close to their source voltage, which provides again the configuration where the gate and source are at the same voltage (which corresponds to a conventional structure). Forward voltages are thus not improved in this embodiment.

In the case where both diodes are reverse biased (voltages V1 and V2 negative), they both have high pocket voltages, which will strongly lower the barrier height of the diodes. Said diodes will thus have a significant leakage current, or even a conductive-type behavior although the voltages are reverse. This case is a problem since the diodes may lose their rectifying function.

Figure 5:
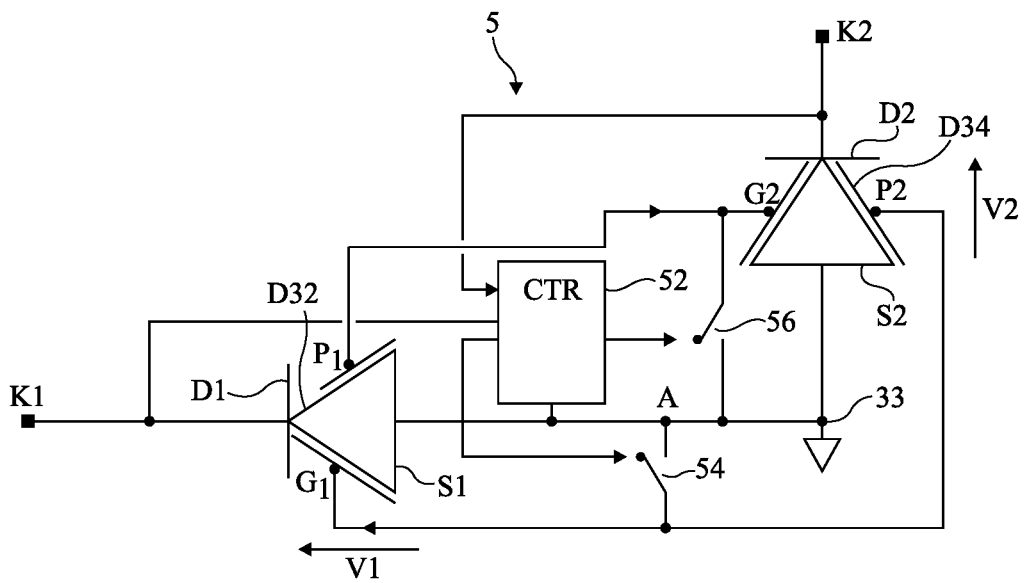
FIG. 5 shows an embodiment of a circuit for controlling the pair of diodes of FIG. 4.

FIG. 5 is an electric diagram of an embodiment of a half-bridge assembly of two diodes D32 and D34 of the type illustrated in FIGS. 2 to 4.

It is provided to interpose, on the one hand between gate G1 belonging to diode D32 and the ground (terminal 33), and on the other hand between gate G2 belonging to diode D34 and this same ground 33, switches 54 and 56 controlled by a circuit 52 (CTR) which will be described hereafter in one of its embodiments. Circuit 52 has the function of causing the turning-on of switches 54 and 56 to ground the gates and the diffusion pockets of the MOS transistors forming the diodes. Switches 54 and 56 are turned on at the same time since an issue is raised in the circuit of FIG. 4 when both diodes are to be non-conductive.

For example, circuit 52 receives one or a plurality of control signals CT from the outside, typically from power converter control circuit 24. A galvanic isolation then has to be provided.

According to another example, circuit 52 integrates circuits for measuring voltages V1 and V2 capable of generating its own control signals. Circuit 52 then comprises two input terminals connected to cathodes K1 and K2.

FIG. 6 shows an example of assembly of controlled half-bridge 5 of FIG. 5 at the secondary of a converter of the type in FIG. 1. For simplification, the elements connected upstream of primary L1 of transformer 12 have not been illustrated in FIG. 6. At the secondary, one can find elements C, L', D32, and D34 and, according to this embodiment, a control circuit 52 associated with switches 54 and 56 such as described in relation with FIG. 5.

In the example of FIG. 6, circuit 52 is formed of an RS flip-flop having its inverted output NQ connected to the control electrodes of switches 54 and 56 and having its respective set (1) and reset (0) inputs receiving signals SET, RESET, generated from a measurement of voltages V1 and V2. As a specific embodiment, switches 54 and 56 are made in the form of N-channel MOS transistors.

FIGS. 7A, 7B, 7C, 7D, 7E, and 7F are timing diagrams illustrating the operation of half-bridge 5 of FIG. 6 when it operates in discontinuous conduction mode, and respectively show examples of shapes of signals SET and RESET as well as corre-sponding examples of shapes of voltages V1 and V2 across diodes D32 and D34 and currents I1 and I2 crossing these diodes (from anode to cathode).

A first period T1 starting at a time t0, during which diode D34 is non-conductive while diode D32 is conductive, is assumed (voltage V2 positive and voltage V1 equal to zero). In this situation, signal SET is activated (high state), which forces the turning-off of switches 54 and 56. This is the normal operation of field-effect diodes with a diffusion pocket such as illustrated in relation with FIGS. 2 to 4. Current I1 in diode D1 increases until a time $t_1$ when the primary of transformer 12 is switched (turning-off of switches K25 and K27, FIG. 1).

At time $t_1$, this turning on of the primary inverts the flow direction at the secondary (free wheel operation) and causes the flowing of a current through diode D34. Diode D32 is non-conductive (its voltage V1 being at a maximum level). At the end of a period T2, starting at time $t_1$ and stopping at a time $t_2$, signal RESET is switched to state 1 to force the turning-on of switches 54 and 56 and to then take back to ground the gates of the transistors of diodes D32 and D34.

Between times $t_1$ and $t_2$, signal SET and signal RESET are in the low state. Switches 54 and 56 however remain off.

The turning-on of switches 54 and 56 ascertains that between times $t_3$ and $t'_0$ (of beginning of the next cycle), while the current in diode D34 has disappeared, both diodes D32 and D34 are effectively non-conductive. During period T3, the voltage thereacross strongly depends on the forward converter operating mode. In a discontinuous operating mode, which generally occurs for a small load, current I2 becomes zero before time $t_0'$ and voltages V1 and V2 oscillate around voltage Vout if the diodes are non-conductive. In a continuous operating mode, which generally takes place for a high load, current I2 does not become zero before time $t_0'$ and there thus is no reverse voltage across the diodes, since they are conducting. The same operation is repeated from time $t_0'$ for a next cycle.

An advantage of the described embodiments is that the use of diffusion pocket diodes provides a gain in performance over conventional diodes, as well as a gain in bulk.

Another advantage is that the provided switching is particularly simple to achieve and avoids the parasitic conduction phenomenon. Advantage is thus taken from this new type of field-effect diodes while preserving the operation of a switched-mode power supply.

The generation of signals SET and RESET and their respective synchronizations depends on the type of application having the half-bridge inserted therein. In practice, according to the application, the voltages present and their expected variations area are analyzed to provide an adapted generation of signals SET and RESET in a design phase.

Various embodiments and variations have been described. Such embodiments and variation may of course be combined. In particular, although the embodiments have been described in relation with an example of diodes having common anodes (formed based on N-channel field-effect transistors), a diode bridge with common cathodes may also be formed by forming the diodes by means of P-channel transistors. Further, the sizing of the components depends on the application as well as on the generation of signals SET and RESET. Finally, the practical implementation of the described embodiments is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit, comprising:
   a first field-effect diode and including a drain, source and gate electrodes as well as a first additional electrode;
   a second field-effect diode and including a drain, source and gate electrodes as well as a second additional electrode;
   a first switch having a first terminal connected to the gate of the first field-effect diode, a second terminal connected to the source of the first field-effect diode and a first control terminal configured to receive a first control signal which actuates the first switch to connect the first and second terminals of the first switch to each other;
   a second switch having a first terminal connected to the gate of the second field-effect diode, a second terminal connected to the source of the second field-effect diode and a second control terminal configured to receive a second control signal which actuates the second switch to connect the first and second terminals of the second switch to each other; and
   a circuit configured to generate the first and second control signals that are applied to the first and second control terminals of the first and second switches, respectively, to control actuation of the first and second switches.

2. The circuit of claim 1, wherein:
   the first additional electrode of the first field-effect diode is directly connected to the gate of the second field-effect diode; and
   the second additional electrode of the second field-effect diode is directly connected to the gate of the first field-effect diode.

3. The circuit of claim 2, wherein the first and second control signals cause the first and second switches to be simultaneously on in a phase where the first and second field-effect diodes are reverse biased and the additional electrode of the second field-effect diode applies a signal to the gate of the first field-effect diode so as to cause the first field-effect diode to become conductive.

4. The circuit of claim 1, wherein the first and second field-effect diodes are interconnected by their anodes.

5. The circuit of claim 1, wherein the first and second field-effect diodes are interconnected by their cathodes.

6. The circuit of claim 1, wherein each of said additional electrodes contacts a diffusion pocket in a substrate.

7. The circuit of claim 1, wherein each of said additional electrodes contacts an insulating layer and forms one plate of a capacitive structure.

8. The circuit of claim 1, further comprising a first inductor having a first terminal coupled to the drain electrode of the first field-effect diode and a second terminal coupled to the drain electrode of the second field-effect diode.

9. The circuit of claim 8, wherein the first inductor is a secondary winding of a transformer.

10. The circuit of claim 8, further comprising a second inductor having a first terminal coupled to the drain electrode of the first field-effect diode and a second terminal coupled to a first output node.

11. The circuit of claim 10, further comprising a capacitor having a first plate coupled to the first output node and a second plate coupled to a second output node, wherein said second output node is coupled to the source electrodes of the first and second field-effect diodes.

12. The circuit of claim 1, wherein the control circuit is a set-reset flip flop having an output coupled to control the selective connection by the first and second switches.

13. The circuit of claim 2, wherein the first and second switches are controlled to be simultaneously on in a phase where the first and second field-effect diodes are reverse biased and the additional electrode of the first field-effect diode applies a signal to the gate of the second field effect diode so as to cause the second field effect diode to become conductive.

14. A circuit, comprising:
   a first field-effect diode having a drain electrode, a source electrode, a gate electrode and a first additional electrode;
   a second field-effect diode having a drain electrode, a source electrode, a gate electrode and a second additional electrode;
   a first switch configured to selectively connect the gate electrode of the first field-effect diode to the source electrode of the first field-effect diode;
   a second switch configured to selectively connect the gate electrode of the second field-effect diode and the source electrode of the second field-effect diode;
   a first circuit conductor coupling the source electrode of the first field-effect diode to the source electrode of the second field-effect diode; and
   a control circuit configured to control the selective connection by the first and second switches,
   wherein the control circuit is a set-reset flip flop having an output coupled to control the selective connection by the first and second switches.

15. The circuit of claim 14, further comprising:
   a second circuit conductor coupling the gate electrode of the first field-effect diode to the second additional electrode of the second field-effect diode; and
   a third circuit conductor coupling the gate electrode of the second field-effect diode to the first additional electrode of the first field-effect diode.

16. A circuit, comprising:
a first field-effect diode including a drain, source and gate electrodes as well as a first additional electrode;
a second field-effect diode including a drain, source and gate electrodes as well as a second additional electrode;
a first switch connected between the gate of the first field-effect diode and the source of the first field-effect diode;
a second switch connected between the gate of the second field-effect diode and the source of the second field-effect diode; and
a circuit configured to control actuation of the first and second switches,
wherein the first and second switches are controlled to be simultaneously on in a phase where the first and second field-effect diodes are reverse biased.

17. The circuit of claim 16, wherein:
the first additional electrode of the first field-effect diode is directly connected to the gate of the second field-effect diode; and
the second additional electrode of the second field-effect diode is directly connected to the gate of the first field-effect diode.

18. The circuit of claim 16, wherein the first and second field-effect diodes are interconnected by their anodes.

19. The circuit of claim 16, wherein the first and second field-effect diodes are interconnected by their cathodes.

20. The circuit of claim 16, wherein each of said additional electrodes contacts a diffusion pocket in a substrate.

21. The circuit of claim 16, wherein each of said additional electrodes contacts an insulating layer and forms one plate of a capacitive structure.

22. A circuit, comprising:
a first field-effect diode and including a drain, source and gate electrodes as well as a first additional electrode;
a second field-effect diode and including a drain, source and gate electrodes as well as a second additional electrode;
a first switch that when actuated directly electrically connects the gate of the first field-effect diode to and the source of the first field-effect diode;
a second switch that when actuated directly electrically connects the gate of the second field-effect diode and the source of the second field-effect diode; and
a circuit configured to control actuation of the first and second switches.

23. The circuit of claim 22, wherein:
the first additional electrode of the first field-effect diode is directly connected to the gate of the second field-effect diode; and
the second additional electrode of the second field-effect diode is directly connected to the gate of the first field-effect diode.

24. The circuit of claim 23, wherein the first and second switches are controlled to be simultaneously on in a phase where the first and second field-effect diodes are reverse biased and the additional electrode of the second field-effect diode applies a signal to the gate of the first field-effect diode so as to cause the first field-effect diode to become conductive.

25. The circuit of claim 22, wherein the first and second field-effect diodes are interconnected by their anodes.

26. The circuit of claim 22, wherein the first and second field-effect diodes are interconnected by their cathodes.

27. The circuit of claim 22, wherein each of said additional electrodes contacts a diffusion pocket in a substrate.

28. The circuit of claim 22, wherein each of said additional electrodes contacts an insulating layer and forms one plate of a capacitive structure.

* * * * *